United States Patent [19]

van de Plassche et al.

[11] 4,405,902

[45] Sep. 20, 1983

[54] PUSH-PULL OUTPUT STAGE

[75] Inventors: Rudy J. van de Plassche; Eise C. Dijkmans, both of Eindhoven, Netherlands

[73] Assignee: U.S. Philips Corporation, New York, N.Y.

[21] Appl. No.: 256,364

[22] Filed: Apr. 22, 1981

[30] Foreign Application Priority Data

May 27, 1980 [NL] Netherlands ............ 8003053

[51] Int. Cl.³ ............................................. H03F 3/30
[52] U.S. Cl. .................................... 330/271; 330/272; 330/274; 330/275
[58] Field of Search ............... 330/262, 271, 272, 273, 330/274, 275

[56] References Cited

U.S. PATENT DOCUMENTS 4,300,103 11/1981 van de Plassche ............ 330/272 X

Primary Examiner—James B. Mullins
Attorney, Agent, or Firm—Thomas A. Briody; William J. Streeter; Edward W. Goodman

[57] ABSTRACT

The invention provides an improved class-B push-pull output stage comprising a first and a second output transistor of a first conductivity type, which stage is provided with a control loop for driving the second transistor in phase opposition as a function of the drive of the first transistor. Said control loop is adapted so that a stable quiescent-current setting is obtained and that the effect of poor high-frequency properties of a third transistor of a conductivity type opposite to the first conductivity type, which transistor is necessarily included in the control loop, is eliminated, so that a wide frequency range is obtained.

7 Claims, 4 Drawing Figures

PUSH-PULL OUTPUT STAGE

BACKGROUND OF THE INVENTION

The invention relates to a push-pull output stage having an input terminal, an output terminal, a first supply terminal, and a second supply terminal, which stage comprises:

A first transistor of a first conductivity type, connected in common-collector arrangement, whose collector is coupled to the first supply terminal, whose emitter is coupled to the output terminal and whose base is coupled to the input terminal;
- a second transistor of the first conductivity type, connected in common-emitter arrangement, whose emitter is coupled to the second supply terminal,
- a third transistor of a second conductivity type opposite to the first conductivity type and connected in common-base arrangement,
- a first signal path, which includes the emitter-collector path of the first transistor and which serves for driving the second transistor as a function of the drive of the first transistor, and
- a first semiconductor junction with a first and a second electrode, which semiconductor junction is included in the collector main-current path of the second transistor and whose first electrode is coupled to the output terminal and the emitter of the first transistor, in such a way that viewed from the output terminal the forward direction of the first semiconductor junction is opposed to the forward direction of the base-emitter junction of the first transistor, and whose second electrode is coupled to the collector of the second transistor.

A push-pull output stage of the type mentioned in the opening paragraph is known from: "Electronics Letters" Vol. 10, No. 15 of July 25, 1974, pages 317, 318 and 319.

In order to enable the second transistor in this circuit to be driven in a suitable manner, the collector circuit of the first transistor includes a diode in forward direction. Via a third transistor of a conductivity type opposite to that of the first and the second transistor, which third transistor is connected in common-base arrangement, the voltage across said diode, which is a measure of the current through the first transistor, is converted into a drive current which is in phase opposition to the input signal, which drive current is applied to the base of the second transistor. As a result of this, the current through the second transistor will be in phase opposition to that through the first transistor.

In an integrated push-pull output stage of this type, the first and the second transistors will generally be vertical npn transistors, while it is necessary to employ a horizontal pnp transistor for the third transistor, which as is known has poor high-frequency properties. In order to mitigate the influence of said poor high-frequency properties in this circuit arrangement, it is advisable to bypass the emitter-collector path of the third transistor with a series connection of a resistor and a capacitor. However, the signal voltage on the emitter of the third transistor is insufficient to drive the second transistor via the series connection of the resistor and capacitor, so that the band-width and the drive range at high frequencies are very limited.

The asymmetry of the measuring circuit in the collector circuit of the first transistor and the drive of the second transistor via a resistor in parallel with its base-emitter junction, causes a substantial temperature dependence of the quiescent current setting and a non-linear transfer. Furthermore, the input impedance of this circuit arrangement is highly dependent on the value of the input signal.

SUMMARY OF THE INVENTION

It is the object of the invention to provide a push-pull output stage of the type mentioned in the opening paragraph, which has improved linearity, a larger bandwidth, and a temperature-independent quiescent-current setting, and which, as the case may be, by means of a limited extension, enables the input impedance to be rendered substantially independent of the value of the input signal.

To this end the invention is characterized in that the push-pull output stage furthermore comprises:
- a measuring circuit at least comprising the base-emitter junction of a fourth transistor of the first conductivity type, which measuring circuit is included between the base of the first transistor and the second electrode of the first semiconductor junction, for generating a drive current, which is derived from the voltage between the base of the first transistor and the second electrode of the first semiconductor junction and for applying said drive current to the base of the second transistor, in phase opposition to the input signal via the first signal path,
- a first impedance in the first signal path, of which one terminal is coupled to the emitter of the third transistor,
- first means for bypassing a part of the first signal path, which part comprises the first impedance and the emitter-collector path of the third transistor, with a suitable second impedance which at least transfers signals of comparatively high frequencies, so that in the case of poor high-frequency properties of the third transistor, the push-pull output stage still performs satisfactorily at high frequencies.

By including, in accordance with the invention, a measuring diode in the collector circuit of the second transistor, which diode is connected in series with the base-emitter junction of the first transistor, and by deriving the drive current for the second trransistor by means of a measuring circuit which is connected in parallel with the series connection of the measuring diode and the base-emitter junction of the first transistor, it can be achieved that said drive current depends both on the current through the first transistor and the current through the second transistor. Thus, the drive current contains a factor which, via the first signal path of the second transistor, also depends on the drive current itself. As the third transistor ensures that the sign of a variation in drive current is reversed, there will be negative feedback, which has a stabilizing effect on the quiescent-current setting and the current-distribution between the first and the second transistors. The latter results in a smooth cross-over.

A further advantage is that by shifting the measuring circuit to the output circuit of the arrangement, a range of signal-voltage swing is obtained between the measuring circuit and the first supply terminal, so that, by means of the first impedance (suitably a resistor), the necessary signal voltage can be obtained for driving the second transistor via the second impedance (suitably a capacitor).

Suitably, the push-pull output stage in accordance with the invention, is arranged so that the measuring circuit comprises a series connection of a second semiconductor junction, with a first and a second electrode, and the base-emitter junction of a fourth transistor of the first conductivity type, both included in forward direction, the drive current being derived from the collector of the fourth transistor.

Class-B operation is then obtained by means of the two semiconductor junctions in the measuring circuit, so that the drive signal for the second transistor becomes available on the collector of the fourth transistor from a high-ohmic source.

Suitably, the push-pull output stage in accordance with the invention, is moreover arranged so that the collector of the fourth transistor is coupled to the emitter of the third transistor via the first impedance, and the emitter of the third transistor is coupled to the first supply terminal via the first impedance-circuit, suitably a current-source circuit.

In this way the phase reversal of the drive current necessary for class-B operation is realized in a simple manner.

With respect to the arrangement of the elements in the measuring circuit, two basic versions are possible, the first version being characterized in that the base of the fourth transistor is coupled to the base of the first transistor, the first electrode of the second semiconductor junction is coupled to the emitter of the fourth transistor and the second electrode of the second semiconductor junction is coupled to the second electrode of the first semiconductor junction, and the second version being characterized in that the emitter of the fourth transistor is coupled to the second electrode of the first semiconductor junction, the first electrode of the second semiconductor junction is coupled to the base of the first transistor, and the second electrode of the second semiconductor junction is coupled to the base of the fourth transistor.

A further drawback of the type of push-pull output stage as published in "Electronics Letters", is that the input impedance depends greatly on the value of the input signal. The cause of this is that, when the first transistor supplies the load current to the output terminal, only one current-amplifying semiconductor junction is included between the input terminal and the output terminal, while, when the second transistor supplies the load current, two current-amplifying semiconductor junctions are present, namely those of the first and the second transistors, in the signal path from the input to the output terminals, so that the input impedance in the last-mentioned case is higher by a factor of the order of magnitude of $\beta$ ($\beta$ being the current-gain factor of the transistors of the first conductivity type) than in the case that the first transistor supplies the load current.

It is a further object of the invention to provide a push-pull output stage with one or more of said characteristic features, which has an input impedance which is substantially independent of the value of the input signal, and to this end it is further characterized in that the push-pull output stage comprises a fifth transistor of the first conductivity type, which transistor is connected in common-collector arrangement, which is included in the base circuit of the first transistor and which is arranged so that, from the input terminal to the output terminal via the base-emitter junction of both the fifth and the first transistor, or via the measuring circuit or part thereof and the first semiconductor junction, effectively always a chain of an equal number of current-amplifying semi-conductor junctions or equivalents thereof is passed through.

A preferred embodiment of the invention with said characteristic feature is further characterized in that said push-pull output stage in addition comprises:

a sixth transistor of the first conductivity type, whose base is coupled to the input terminal, whose emitter is coupled to the base of the fourth transistor via a first junction point, and whose collector is coupled to the emitter of the fifth transistor and the base of the first transistor, a second impedance circuit, suitably a current-source circuit, which is included between the base of the fifth transistor and the first supply terminal, a third impedance circuit, suitably a current-source circuit, which is included between the first junction point and the second supply terminal, and a third semiconductor junction, which is connected in series with the second semiconductor junction between the base of the fifth transistor and the first junction point, the second and the third semiconductor junction being included in forward direction, while furthermore the collector of the fifth transistor is coupled to the first supply terminal and the emitter of the fourth transistor is coupled to the second electrode of the second semiconductor junction.

Further advantages of this preferred embodiment are that because the collector of the sixth transistor carries substantially the same signal as its base, the influence of the "Miller" capacitance is substantially reduced, so that considerably better high frequency properties are obtained when driving the push-pull output stage from a high-ohmic signal source;

and that the main current of the sixth transistor also passes through the main current path of the fifth transistor, so that one current-source circuit may be dispensed with.

DESCRIPTION OF THE DRAWING

The invention will now be described in more detail with reference to the following Figures.

DESCRIPTION OF THE PREFERRED EMBODIMENT

In the various Figures, transistor $T_1$ and transistor $T_2$ are the two npn output transistors of a push-pull output stage, transistor $T_1$ being connected in common-collector arrangement. The collector of transistor $T_1$ is connected to the positive supply terminal 5 and its base is connected to the input 3. The emitter of transistor $T_2$ is connected to the negative supply terminal 10.

Transistor $T_1$ is employed as emitter-follower for the input signal and transistor $T_2$ is employed as a controlled current source, which is driven by a drive current, which depends on the drive of transistor $T_1$ and which is applied to the base of transistor $T_2$ via a pnp transistor $T_3$.

Figure 1:
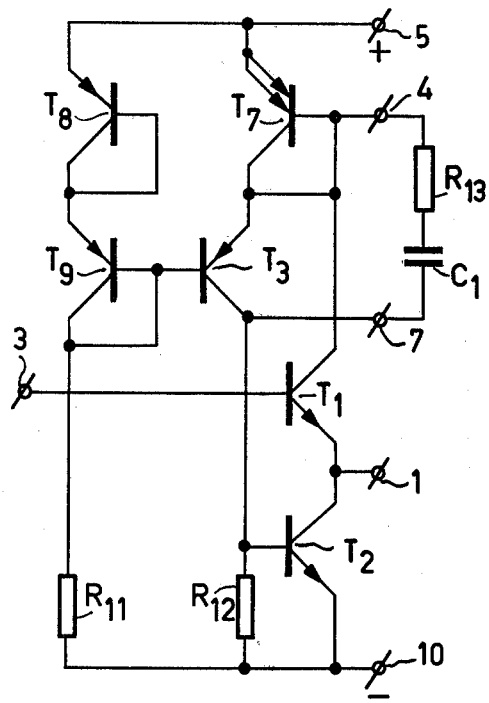
FIG. 1 shows the circuit diagram of a known push-pull output stage with two npn output transistors.

A known method for deriving the drive current can be found in said article in "Electronics Letters" and is represented in FIG. 1.

In the relevant circuit arrangement, the collector of transistor $T_1$ is coupled to the positive supply terminal 5 via a pnp transistor $T_7$, which is connected as a diode in forward direction. The emitter of transistor $T_3$ is connected to the base and the collector of transistor $T_7$, the collector of transistor $T_1$ and a terminal 4. The collector of transistor $T_3$ is coupled to the negative supply terminal 10 via a resistor $R_{12}$ and is further connected to the base of transistor $T_2$ and a terminal 7. The base of transistor $T_3$ is coupled to the negative supply terminal 10 via a resistor $R_{11}$ and furthermore to the positive supply terminal 5 via a series connection of pnp transistors $T_8$ and $T_9$, which are connected as diodes in forward direction. The base of transistor $T_3$ is thus maintained at a substantially constant potential relative to the positive supply terminal 5.

Assuming that the voltage on input 3 decreases, the collector current of transistor $T_1$ and thus the voltage across transistor $T_7$ will decrease upon crossing-over, causing the voltage across the base-emitter junction of transistor $T_3$ to increase, which results in an increase in drive current for transistor $T_2$, so that the last-mentioned transistor will supply the load current as well as so much current to the emitter of transistor $T_1$ that this transistor remains just conductive, which is detected by means of transistor $T_7$.

The signal loop comprising the transistors $T_1$, $T_7$, $T_3$ and $T_2$ may therefore be regarded as a control loop, which ensures that transistor $T_1$ remains conductive. Because of the inevitable horizontal pnp transistor $T_3$, it is found that said control loop has poor high-frequency properties, which limit the bandwidth and which are difficult to remedy. The inclusion of a series connection of a resistor $R_{13}$ and a capacitor $C_1$ between the terminals 4 and 7, as is recommended in said article published in "Electronics Letters", does not provide much improvement, because the signal voltage on the emitter of transistor $T_3$ is insufficient to drive transistor $T_2$ at high frequencies via said series connection of the resistor $R_{13}$ and the capacitor $C_1$. At low frequencies $T_2$ is normally driven via transistor $T_1$.

Further disadvantages are the non-linear transfer and the temperature dependence of the quiescent-current setting, which are caused by the asymmetrical arrangement of the measuring circuit comprising the transistors $T_3$, $T_7$, $T_8$ and $T_9$ and the presence of the resistor $R_{12}$.

Figure 2:
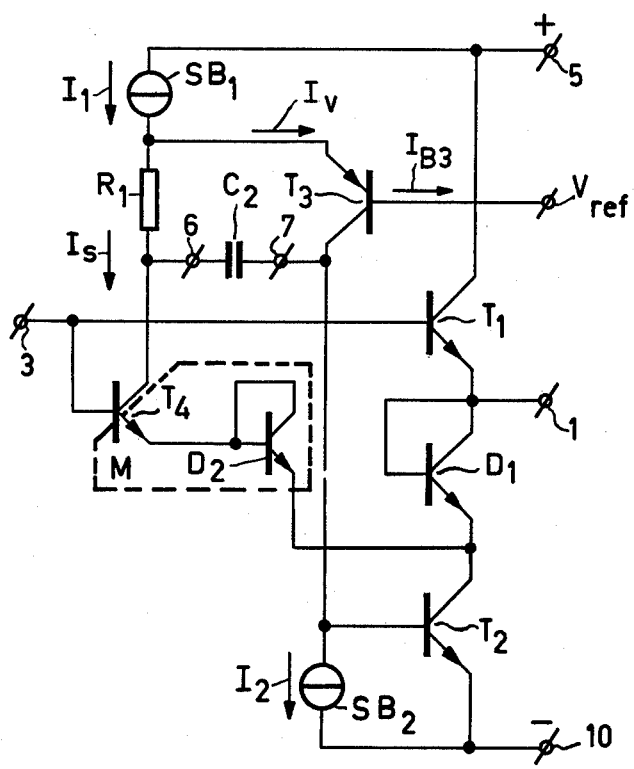
FIG. 2 shows the circuit diagram of a preferred embodiment of a push-pull output stage in accordance with the invention.

FIG. 2 shows a preferred embodiment of a push-pull output stage in accordance with the invention. The collector of transistor $T_1$ is connected to the positive supply terminal 5, the base to the input 3 and the emitter to the output 1.

The emitter of transistor $T_2$ is connected to the negative supply terminal 10. Between the emitter of transistor $T_1$ and the collector of transistor $T_2$ an npn transistor $D_1$, connected as a diode in forward direction, is included in such a way that the common base-collector terminal of transistor $D_1$ is connected to the emitter of transistor $T_1$ and the emitter of transistor $D_1$ is connected to the collector of transistor $T_2$.

A measuring circuit M, which is marked by a dashed line in FIG. 2, comprises npn transistor $D_2$, which is connected as a diode, and the base-emitter junction of an npn transistor $T_4$.

The emitter of transistor $D_2$ is connected to the emitter of transistor $D_1$.

The emitter of transistor $T_4$ is connected to the common base-collector terminal of transistor $D_2$, and its base to the base of transistor $T_1$.

The emitter of transistor $T_3$ is coupled to the collector of transistor $T_4$ via a resistor $R_1$ and to the positive supply terminal 5 via a current source circuit $SB_1$, and the base of transistor $T_3$ is connected to a constant voltage $V_{ref}$.

The collector of transistor $T_3$ is connected to the base of transistor $T_2$ and, via a current-source circuit $SB_2$, it is coupled to the negative supply terminal 10. It is to be noted that the current source circuit $SB_1$ may also be included between the positive supply terminal 5 and the collector of transistor $T_4$. Terminal 6 is connected to the collector of transistor $T_4$ and terminal 7 is connected to the collector of transistor $T_3$.

The circuit arrangement operates as follows:

The measuring circuit M, marked by a dashed line in FIG. 2, which circuit comprises the base-emitter junction of transistor $T_4$ and transistor $D_2$, which is connected as a diode, derives the drive current $I_s$ from the voltage between the base of transistor $T_1$ and the emitter of transistor $D_1$, which current is available from a high-ohmic source on the collector of transistor $T_4$ and, after being subjected to a number of operations, to be described hereinafter, is applied to the base of transistor $T_2$ via the first signal path.

Phase inversion of the drive current $I_s$ is achieved by subtracting the drive current from the current $I_1$ supplied by the current source circuit $SB_1$ and applying the resulting difference current $I_v$ to the emitter of transistor $T_3$. Said difference current $I_v$, with a loss of a fraction equal to that the base current of transistor $T_3$, is applied to the base of transistor $T_2$ via the emitter-collector path of transistor $T_3$ and after subtraction of the current $I_2$ supplied by the current source circuit $SB_2$. The customary class-B operation is obtained in that, via the action of the control loop comprising the measuring circuit, the first signal path and transistor $T_2$, the sum of the voltages across the base-emitter junction of transistor $T_1$ and transistor $D_1$, which is connected as a diode, is maintained substantially constant, the quiescent-current setting being mainly determined by the magnitude of the currents $I_1$ and $I_2$ which are respectively supplied by the current-source circuits $SB_1$ and $SB_2$.

Eliminating the effect of the poor high-frequency properties of the horizontal pnp transistor $T_3$ can be realized with success by including a capacitor $C_2$ between the terminals 6 and 7, so that for high frequencies, the resistor $R_1$ and the transistor $T_3$ are bypassed. Since the drive current $I_s$ produces sufficient signal voltage across the resistor $R_1$ to drive transistor $T_2$ via capacitor $C_2$, the circuit also performs satisfactorily at high frequencies.

Figure 3:
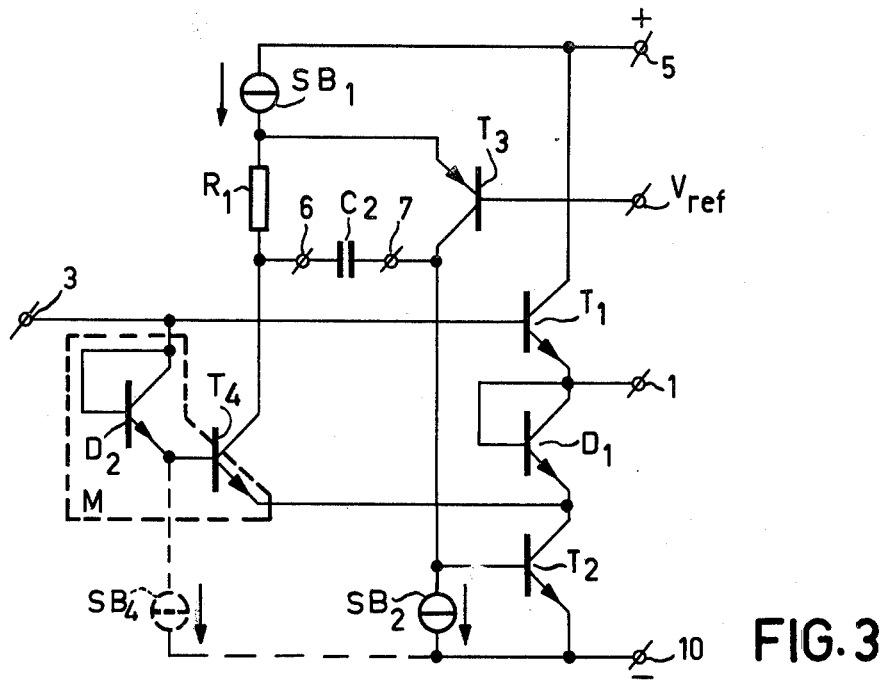
FIG. 3 shows a variant to the diagram of FIG. 2.

FIG. 3 shows a variant to the circuit arrangement of FIG. 2. In this variant the measuring circuit M is again marked by a dashed line. The common base-collector terminal of transistor $D_2$ is connected to the base of transistor $T_1$ and input 3. The emitter of transistor $D_2$ is connected to the base of transistor $T_4$ and the emitter of transistor $T_4$ is connected to the emitter of transistor $D_1$. For this variant it is advisable to add a current source $SB_4$, as shown in dashed line in FIG. 3, in order to obtain sufficient quiescent current in the output stage.

For the rest, the design and operation of this circuit arrangement are the same as for that of FIG. 3. The properties only differ with respect to the input impedance, which for this circuit is slightly lower than the circuit of FIG. 2. The contribution of the impedance of transistor $D_2$, which is connected as a diode, to the input impedance of the push-pull output stage in the circuit of FIG. 2, is approximately $\beta$ times as great as for the variant of FIG. 3.

Figure 4:
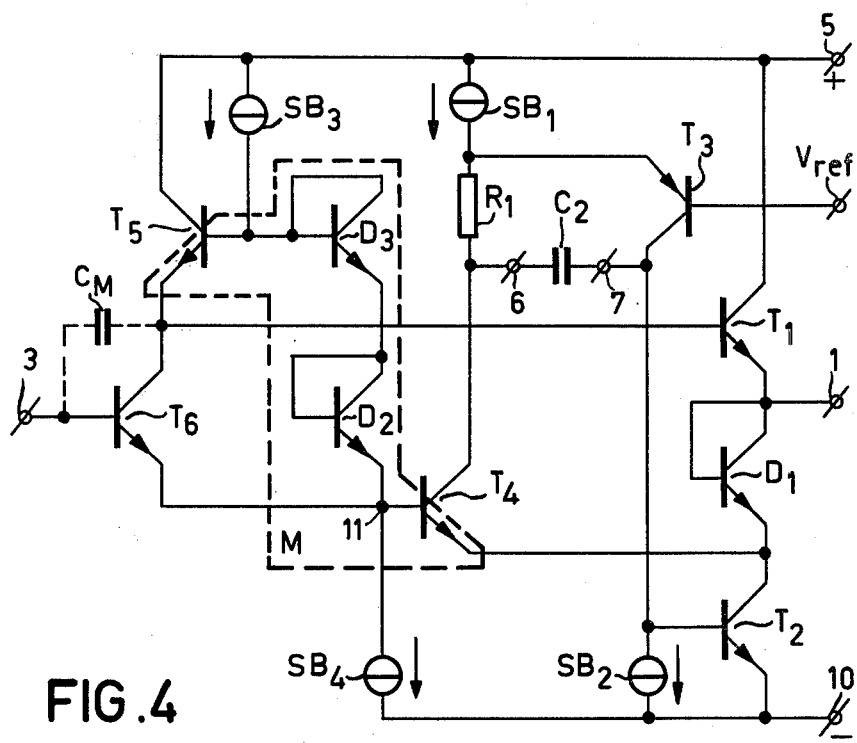
FIG. 4 represents a preferred embodiment of a push-pull output stage in accordance with the invention, whose input impedance is substantially independent of the value of the input signal.

FIG. 4 shows a preferred embodiment of a push-pull output stage in accordance with the invention having an input impedance which is substantially independent of the value of the input signal. In comparison with the push-pull output stage of FIG. 3 the circuit has been extended with npn transistors $T_5$ and $T_6$, an npn transistor $D_3$, which is connected as a diode, and current-source circuits $SB_3$ and $SB_4$. The base of transistor $T_6$ is connected to the input 3, the emitter is coupled to the base of transistor $T_4$ via a junction point 11, and the collector is connected to the emitter of transistor $T_5$ and to the base of transistor $T_1$.

The collector of transistor $T_5$ is connected to the positive supply terminal 5 and the base is coupled to the positive supply terminal 5 via the current-source circuit $SB_3$.

Via current-source circuit $SB_4$, the junction point 11 is coupled to the negative supply terminal 10 and a series connection of the transistors $D_2$ and $D_3$, which are connected as diodes, is included between the base of transistor $T_5$ and the junction point 11 in such a way that they are arranged in forward direction.

In this preferred embodiment of a push-pull output stage in accordance with the invention, a signal path is formed between input 3 and the base of transistor $T_1$ by:

The base-emitter junction of transistor $T_6$, the transistors $D_2$ and $D_3$, which are connected as diodes, and the base-emitter junction of transistor $T_5$.

The measuring circuit M, which is marked by a dashed line in FIG. 4, comprises:

the base-emitter junction of transistor $T_4$, transistors $D_2$ and $D_3$, which are connected as diodes, and the base-emitter junction of transistor $T_5$.

Apart from the advantages of the circuit arrangements of FIGS. 2 and 3 the present embodiment has the major advantage that the input impedance is high, because of the input emitter-follower, transistor $T_6$, and substantially independent of the value of the input signal, because, from the input 3 to the output 1, via the signal path constituted by the base-emitter junction of transistor $T_6$, the base-emitter junction of transistor $T_4$ and the transistor $D_1$, which is connected as a diode, two amplifying semiconductor junctions plus one equivalent thereof are passed through, while, via the signal path constituted by the base-emitter junction of transistor $T_6$, transistors $D_2$ and $D_3$, the base-emitter junction of transistor $T_5$ and the base-emitter junction of $T_1$ three current-amplifying semiconductor junctions are passed through; it is to be noted that the signal current amplified by transistor $T_1$ passes through transistor $D_1$, so that with respect to its impedance transistor $D_1$ behaves like a current-amplifying semiconductor junction and may therefore be regarded as an equivalent thereof.

Further advantages are that the input capacitance of the circuit is substantially reduced by compensation of the effect of the "Miller" capacitance $C_M$ of transistor $T_6$, which is of advantage in the case of a high-ohmic drive of the push-pull output stage, and which is achieved in that the collector of transistor $T_6$, via the signal path constituted by transistors $D_2$ and $D_3$ and the base-emitter junction of transistor $T_5$, receives substantially the same signal as that which is present on the emitter of transistor $T_6$ and thus on its base;

and that the main current of transistor $T_6$ also passes through the main current path of transistor $T_5$, so that a current-source circuit is dispensed with.

What is claimed is:

1. A push-pull output stage having an input terminal, an output terminal, a first supply terminal, and a second supply terminal, which output stage comprises:

a first transistor of a first conductivity type, connected in common-collector arrangement, the collector thereof being coupled to the first supply terminal, the emitter thereof being coupled to the output terminal and the base thereof being coupled to the input terminal;

a second transistor of the first conductivity type, connected in common-emitter arrangement, the emitter thereof being coupled to the second supply terminal;

a first semiconductor junction having a first and a second electrode, which semiconductor junction is included in the collector main current path of the second transistor, the first electrode thereof being coupled to the output terminal and the emitter of the first transistor, in such a way that, viewed from the output terminal, the forward direction of the first semiconductor junction is opposed to the forward direction of the base-emitter junction of the first transistor, and the second electrode thereof being coupled to the collector of the second transistor;

a third transistor of a second conductivity type opposite to the first conductivity type, connected in common-base arrangement, the base thereof being coupled to a reference potential; and a first signal path, which includes the emitter-collector path of the third transistor, the collector of the third transistor being coupled to the base of the second transistor;

characterized in that the push-pull output stage further comprises:

a measuring circuit comprising the base-emitter junction of a fourth transistor of the first conductivity type, said measuring circuit being coupled between the base of the first transistor and the second electrode of the first semiconductor junction, the collector of the fourth transistor being coupled to said first signal path for applying a drive current, generated thereby from the voltage between the base of the first transistor and the second electrode of the first semiconductor junction, to the base of the second transistor in phase opposition to the input signal;

a first impedance in the first signal path, having one terminal coupled to the emitter of the third transistor and the other terminal coupled to the collector of the fourth transistor; and first means for bypassing a part of the first signal path, coupled between the other terminal of the first impedance and the collector of the third transistor, said first means for bypassing comprising a second impedance which, at least, transfers signals of comparatively high frequencies, whereby, in the case of poor high-frequency properties of the third transistor, the push-pull output stage still performs satisfactorily at high frequencies.

2. A push-pull output stage as claimed in claim 1, characterized in that the measuring circuit further comprises a second semiconductor junction with a first and a second electrode, which is connected in series with the base-emitter junction of the fourth transistor, both connected in forward direction, the drive current being derived from the collector of the fourth transistor.

3. A push-pull output stage as claimed in claim 2, characterized in that the emitter of the third transistor is coupled to the first supply terminal via a first impedance circuit comprising a current-source circuit.

4. A push-pull output stage as claimed in claim 2 or 3, characterized in that the base of the fourth transistor is coupled to the base of the first transistor, the first electrode of the second semiconductor junction is coupled to the emitter of the fourth transistor and the second electrode of the second semiconductor junction is coupled to the second electrode of the first semiconductor junction.

5. A push-pull output stage as claimed in claim 2 or 3, characterized in that the emitter of the fourth transistor is coupled to the second electrode of the first semiconductor junction, the first electrode of the second semiconductor junction is coupled to the base of the first transistor, and the second electrode of the second semiconductor junction is coupled to the base of the fourth transistor.

6. A push-pull stage as claimed in claim 2 or 3, characterized in that the output stage comprises a fifth transistor of the first conductivity type, which fifth transistor is connected in common-collector arrangement, the base thereof being coupled to the second semiconductor junction, the collector thereof being coupled to the first supply terminal, and the emitter thereof coupled to the base of the first transistor, whereby, from the input terminal to the output terminal, via the base-emitter junctions of both the fifth and the first transistor or via the measuring circuit and the first semiconductor junction, there is effectively always a chain of an equal number of active current-amplifying semiconductor junctions passed through.

7. A push-pull output stage as claimed in claim 6, characterized in that said push-pull output stage further comprises:

a sixth transistor of the first conductivity type the base thereof being coupled to the input terminal, the emitter thereof being coupled to the base of the fourth transistor via a first junction point, and the collector thereof being coupled to the emitter of the fifth transistor and the base of the first transistor, a second impedance circuit comprising a current-source circuit included between the base of the fifth transistor and the first supply terminal, a third impedance circuit comprising a current-source circuit included between the first junction point and the second supply terminal, and a third semiconductor junction connected in series with the second semiconductor junction between the base of the fifth transistor and the first junction point, the second and the third semiconductor junctions being included in forward direction, while, in addition, the emitter of the fourth transistor is coupled to the second electrode of the second semiconductor junction.

* * * * *